(12) United States Patent
Lin et al.

(10) Patent No.: US 11,930,577 B2
(45) Date of Patent: Mar. 12, 2024

(54) USAGE-LEVEL BASED LIGHTING ADJUSTMENTS TO COMPUTING DEVICE HOUSINGS

(71) Applicant: Hewlett-Packard Development Company, L.P., Spring, TX (US)

(72) Inventors: Po-Hsien Lin, Taipei (TW); An Chih Chu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 360 days.

(21) Appl. No.: 17/058,941

(22) PCT Filed: Nov. 29, 2018

(86) PCT No.: PCT/US2018/063056
§ 371 (c)(1),
(2) Date: Nov. 25, 2020

(87) PCT Pub. No.: WO2020/112114
PCT Pub. Date: Jun. 4, 2020

(65) Prior Publication Data
US 2021/0298140 A1    Sep. 23, 2021

(51) Int. Cl.
*H05B 47/10* (2020.01)
*G08B 5/00* (2006.01)
*H05B 47/105* (2020.01)
*G06F 1/18* (2006.01)

(52) U.S. Cl.
CPC ............ *H05B 47/105* (2020.01); *G08B 5/00* (2013.01); *G06F 1/181* (2013.01)

(58) Field of Classification Search
CPC .................................................. H05B 47/105
See application file for complete search history.

(56) References Cited

U.S. PATENT DOCUMENTS

| 5,661,658 | A  | 8/1997  | Putt et al.       |
|-----------|----|---------|-------------------|
| 5,941,989 | A  | 8/1999  | Klein             |
| 6,789,206 | B1 | 9/2004  | Wierzbicki et al. |
| 7,248,239 | B2 | 7/2007  | Dowling et al.    |
| 8,033,695 | B2 | 10/2011 | Kerr et al.       |
| 8,489,909 | B2 | 7/2013  | McKnight et al.   |
| 9,153,106 | B1 | 10/2015 | Kuscher et al.    |

(Continued)

FOREIGN PATENT DOCUMENTS

| CN | 1591351 A   | 3/2005  |
|----|-------------|---------|
| CN | 100351807 C | 11/2007 |

(Continued)

OTHER PUBLICATIONS

Chu, et al., "LED Lighting Control by CPU Core-Power Consumption Through ASPM and BIOS ACPI/OS Flag Comparison", Oct. 2017, Research Disclosure, 4 pgs.

*Primary Examiner* — Travis R Hunnings
(74) *Attorney, Agent, or Firm* — Quarles & Brady LLP

(57) ABSTRACT

In one example in accordance with the present disclosure, a computing device is described. The computing device includes a housing and a light source to illuminate through a window in the housing. The computing device also includes a controller. The controller determines a usage level of a processor of the computing device. The controller also adjusts a characteristic of the light source based on a determined usage level of the processor.

19 Claims, 9 Drawing Sheets

(56) References Cited

U.S. PATENT DOCUMENTS

| | | | |
|---|---|---|---|
| 9,594,656 B2 | 3/2017 | Shafi | |
| 9,645,908 B2 | 5/2017 | Bowers | |
| 9,817,461 B2 | 11/2017 | Ohida et al. | |
| 9,881,465 B2 | 1/2018 | Kuscher et al. | |
| 2008/0258927 A1 | 10/2008 | Chen et al. | |
| 2009/0303073 A1* | 12/2009 | Gilling | G06F 1/1684 340/815.45 |
| 2014/0077962 A1 | 3/2014 | Wang et al. | |
| 2016/0275772 A1 | 9/2016 | Apcar | |
| 2017/0048937 A1* | 2/2017 | Wang | H02J 50/10 |

FOREIGN PATENT DOCUMENTS

| | | |
|---|---|---|
| CN | 101253813 A | 8/2008 |
| CN | 104756035 A | 7/2015 |
| CN | 105259517 A | 1/2016 |
| CN | 205067589 U | 3/2016 |
| JP | 62171047 A | 7/1987 |

* cited by examiner

USAGE-LEVEL BASED LIGHTING ADJUSTMENTS TO COMPUTING DEVICE HOUSINGS

BACKGROUND

Computing devices are used every day in society by a variety of different types of users such as business personnel and individuals within their home. Based on different factors, a computing device may be under different loads. For example, during peak business hours when a user is executing many applications, the processor of the computing device may be under a heavier load, which can negatively impact system performance. By comparison, at an earlier hour of the day, a computing device may have a lighter load, which has a lower impact on the performance of other applications. In yet another example, the computer may be idle, such as outside of business hours.

BRIEF DESCRIPTION OF THE DRAWINGS

The accompanying drawings illustrate various examples of the principles described herein and are part of the specification. The illustrated examples are provided for illustration, and do not limit the scope of the claims.

Figure 1:
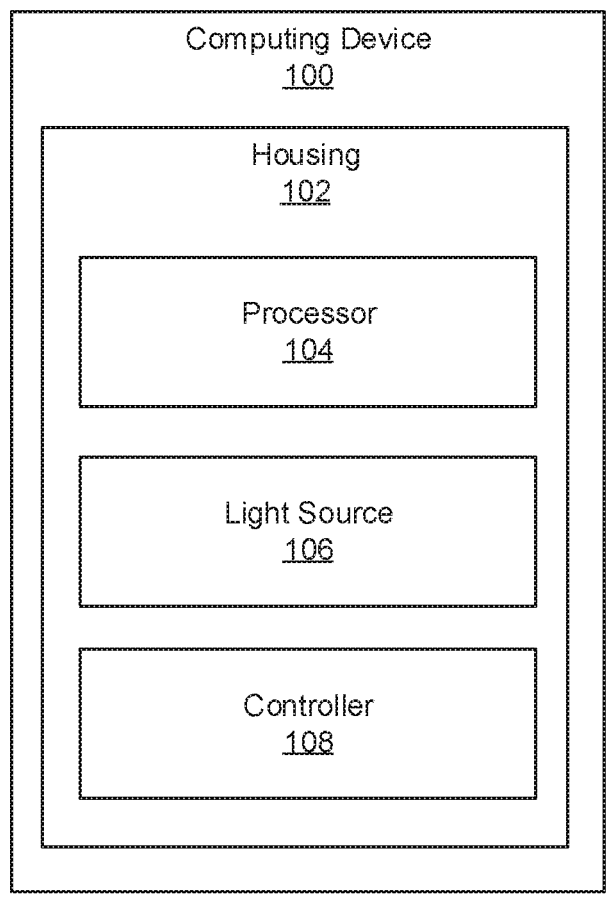
FIG. 1 is a block diagram of a computing device with usage-based lighting adjustments, according to an example of the principles described herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

As noted above, computing devices are used around the world with many individuals using computing devices every day. As computing devices are playing a larger role in day-to-day operations of an increasing number of users, the load placed on computing devices is also increasing. That is, computing devices are executing more and more applications and in many cases doing so simultaneously. As an example, a user may be running 1) a web browser with multiple open windows, 2) an audio player to listen to music while working, and 3) a video rendering application to generate a video clip. Obviously, at other times the load on a computing device may not be as heavy. For example, a user at night may be catching up on news via a single web page. As yet another example, the computing device may be idle, running no applications and simply maintaining the computing device in a standby state.

While computing devices obviously play a relevant role in many people's lives, enhancements to their operation may improve their effectiveness as a tool to those users. As described above, the load on a computing device may affect system performance. For example, a computing device running many applications may run slower, and in some cases may cause some applications to crash. Still further, the loading of the computing device may affect the hardware components. For example, a processor that is under constant heavy loading may generate more heat than can be dissipated by a cooling system. Thus, the processor may have reduced performance and may prematurely fail due to overloading and overheating.

Accordingly, the present specification describes a computing device that provides an indication of processor loading such that a user can easily visualize the load on a processor and act accordingly. For example, the user may take any number of remedial actions such as closing certain applications.

Specifically, the present specification describes a computing device that has a housing with a window. A light source, or a cluster of lighting elements, illuminate through the window. The color of the light is mapped to a loading level of the processor. For example, the load of a processor may be defined by the voltage that it is consuming to run the different applications. Accordingly, a controller of the computing device receives a value indicative of the voltage consumed by the processor. The light source then generates a color of light that maps to the load level. For example, a blue light may indicate the processor is under a relatively light load whereas a red light may indicate the processor is under a relatively heavy load. In one example, if the value indicative of the voltage consumed by the processor is less than a certain value, the light source is turned off, thus conserving electrical energy by not illuminating the light source when the computing device is not in use.

Specifically, the present specification describes a computing device. The computing device includes a housing, a processor, and a light source to illuminate through a window in the housing. A controller of the computing device 1) determines a usage level of the processor and 2) adjusts a characteristic of the light source based on a determined usage level of the processor.

In another example, the computing device includes the housing and the processor. In this example, the computing device includes multiple light emitting diodes (LEDs) to illuminate through a window in the housing. Characteristics of the LEDs are adjusted and combined to output any of a variety of colors along a continuous visible spectrum. The computing device also includes a controller. The controller includes an input to receive a voltage consumption level of the processor. An output per LED of the computing device adjusts a characteristic of a respective LED based on a determined voltage consumption level of the processor. In this example, the voltage consumption level maps to a color along the continuous visible spectrum. The computing device also includes a database to map voltage consumption levels to a characteristics of the multiple LEDs.

The present specification also describes a method. According to the method, a voltage consumption level of a processor of a computing device is determined. Based on the determined voltage consumption level, characteristics of at least on lighting element is determined. These lighting elements illuminate through a window on a housing of the computing device. A control signal is then applied to the at least one lighting element based on determined characteristics.

Such a computing device 1) provides a simple visual cue of processor usage; 2) is easily implemented on the computing device with simple hardware components; 3) improves overall computing device performance; and 4) increases component operating life.

Turning now to the figures, FIG. 1 is a block diagram of a computing device (100) with usage-based lighting adjustments, according to an example of the principles described herein. A computing device (100) may refer to any device that includes a processor (104) and memory. For example, the computing device (10) may be a desktop computer, an all-in-one computer, a laptop computer, a tablet, a mobile device such as a smartphone, a gaming system, a media server or any other component with a processor (104) and memory. The computing device (100) includes a housing (102) which refers to an external shell that holds the components of the computing device (100). For example, a tower of a desktop computer that holds the drives, processors, memory, input/output interfaces, and other components may be a housing (102). The housing (102) may be made out of a variety of materials including plastic and/or a metallic material among others. The housing (102) may be of any size and shape and serves to protect the components from mechanical/electrical damage and other environmental conditions.

The computing device (100) includes a processor (104). The processor (104) refers to at least one processor and other resources used to process programmed instructions. For example, the processor (104) may be a number of central processing units (CPUs), microprocessors, and/or other hardware devices suitable for retrieval and execution of instructions. In one example, the processor (104) may include a number of electronic circuits comprising a number of electronic components for performing the functionality of a number of instruction sets.

The computing device also includes a light source (106). The light source (106) refers to a single lighting element or multiple lighting elements that emit energy waves in the visible spectrum. For example, the light source (106) may be an incandescent filament. In another example, the light source (106) includes multiple light emitting diodes which each emit a particular color of light. The lighting elements may be able to emit light with varying characteristics. For example, the lighting elements may emit light at different intensity, brightness, and/or frequency.

In this example, the light emitted from the light source (106) may be an indicator of processor (104) usage. That is, light with certain characteristics, such as intensity, brightness, and/or color may indicate that the processor (104) has one loading and light with other characteristics may indicate a different loading for the processor (104).

The light source (106) emits light that is visible outside the housing (102). For example, the light source (106) may emit through the housing (102). For example, the housing (102) may include a window that may be formed of an opening, a transparent material, or a translucent material. That is, the window may be a material, or lack thereof, through which a user can view the light emitted by the light source (106).

The computing device (100) also includes a controller (108). In general, the controller (108) generates a visual output that is indicative of the usage level of the processor (104) of the computing device (100). Specifically, the controller (108) may determine a usage level of the processor (104) of the computing device (100) and then control the light source (106) to 1) generate an output specific to the determined usage level or 2) turn off the light source (106) based on the determined usage level. In some examples, the usage level of the processor (104) may be represented by a processor voltage level. That is, the load on the processor (104) is directly related to the voltage consumed by the processor (104). For example, during operation, if the processor (104) is more heavily relied on, that is if more applications rely on the processor (104), or certain applications use more processing bandwidth, the processor (104) may be supplied with additional electrical power. By comparison, if applications are closed and less processing power is used, less electrical power, i.e., voltage, may be supplied to the processor (104). Accordingly, determining the usage level of the processor (104) may include determining a voltage level of the processor (104).

With the usage level of the processor (104) determined, the controller (108) adjusts a characteristic of the light source (106). For example, the controller (108) may adjust the illumination intensity of the light source (106). In the case of the light source (106) including multiple lighting elements, such as multiple LEDs, each lighting element may be adjusted separately. As LEDs are additive, the different lighting characteristics may allow for multiple combinations of lighting effects. For example, if a red, green, and blue LED are implemented, different combinations of different intensity/brightness of these different LEDs allows for any color across the visible spectrum to be presented. In some examples, the controller (108) may turn off the light source (106), for example if processor usage is below a threshold level.

As described above, the controller (108) may adjust the characteristics of the light source (106) based on the determined processor (104) usage level. That is, there may be a mapping between characteristics of the light source (106) and a determined processor (104) usage level. In one example, increasing brightness may indicate heavier loads. In yet another example, different colors may indicate different loads. For example, colors on the blue end of the spectrum may represent lighter loads. As the load of the processor (104) gets heavier, the output colors may change. For example, colors on the red end of the spectrum may be used to indicate a heavy processor (104) load.

In some examples, the controller (108) operates in real time. That is, rather than determining load at predetermined points in time, the controller (108) may collect information continuously, such as multiple times per second to determine processor (104) usage and display a corresponding color accordingly. That is, the load on a processor (104) may change frequently, even every second. Accordingly, the present computing device (100) allows for real time determination of processor (104) load.

Thus, the present specification describes a system wherein a user can easily identify processor (104) usage via the characteristics of the light emanating from the light source (106). A user may then take certain remedial measures such as turning off the computing device (100), shutting down certain applications, and/or increasing cooling systems to avoid component damage.

Moreover, the present computing device (100) allows for light source (106) control entirely using hardware components without program instructions. That is, rather than relying on a software application to alter system parameters, the controller (108) is entirely hardware based, thus providing for power indication without draining on memory resources and disk space. Still further, by turning off the light source (106) when the computing device (100) is idle conserves energy as the light source (106) does not illuminate when the computing device (100) is not in use.

Figure 2:
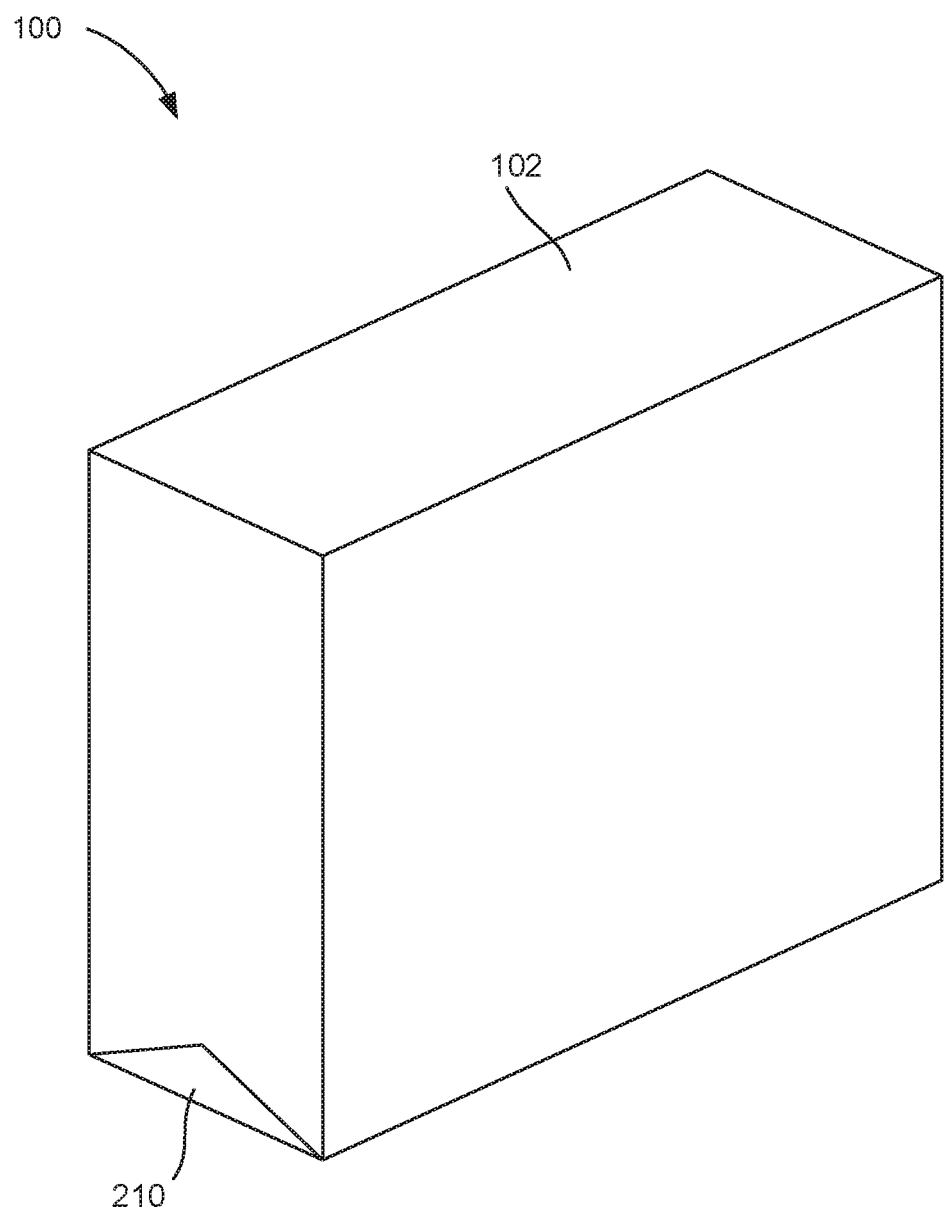
FIG. 2 is an isometric view of a computing device with usage-based lighting adjustments, according to an example of the principles described herein.

FIG. 2 is an isometric view of a computing device (100) with usage-based lighting adjustments, according to an example of the principles described herein. As described above, the computing device (100) may take any variety of forms including a desktop computing device (100). FIG. 2 clearly depicts the housing (102) that holds the processor (FIG. 1, 104), controller (FIG. 1, 108) and other components of the computing device (100). The computing device (100) may be coupled to a display device and various input/output devices such as speakers, a microphone, a keyboard, and a mouse to facilitate use.

FIG. 2 also depicts the window (210) through which the light source (FIG. 1, 106) emanates light. In the example depicted in FIG. 2, the window (210) is disposed on a lower front side of the housing (102). As described above, the window (210) may be an aperture, or may be a transparent or translucent material that diffuses the light emanating from the light source (FIG. 1, 106). While FIG. 2 depicts a particular location, size, and shape of the window (210), the window (210) may take any size and shape and be disposed on other locations of the housing (102) as long as a user may view the emanated light through the window (210).

Figure 3:
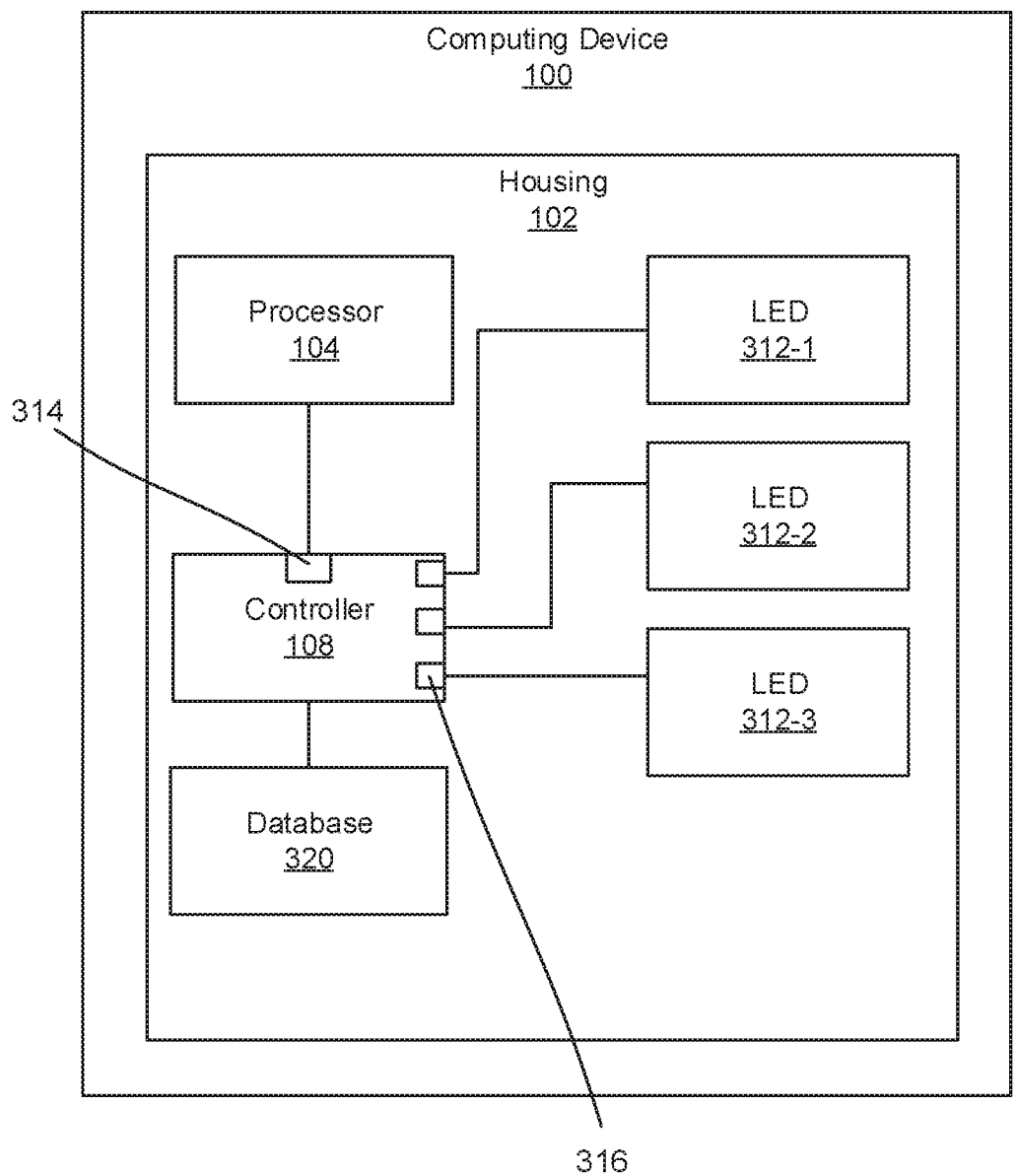
FIG. 3 is a diagram of a computing device with usage-based lighting adjustments, according to an example of the principles described herein.

FIG. 3 is a diagram of a computing device (100) with usage-based lighting adjustments, according to an example of the principles described herein. As described above, the computing device (100) includes a housing (102) that holds a processor (104) and controller (108). The housing (102) also holds the light source (FIG. 1, 106) which in the example depicted in FIG. 3 includes multiple LED (312) lighting elements. While FIG. 3 depicts three LEDs (312-1, 312-2, 312-3), the light source (FIG. 1, 106) may include any number of LEDs (312) or other lighting elements. The LEDs (312) represent an additive coloring scheme. That is, the emissions from the LEDs (312) combine in an additive form to generate new colors. For example, the first LED (312-1) may be a red LED (312) emanating red color light, the second LED (312-2) may be a blue LED (312) emanating blue color light, and the third LED (312-3) may be a green LED (312) emanating green color light. As the light from these LEDs (312) combines, new and different colors may be formed.

The LEDs (312) may be variable in their emitting characteristics. That is, each LED (312), based on the amount of electrical stimulus applied, can emit various intensities of the colored light. For example, if a higher voltage is passed to an LED (312), a brighter intensity of the colored light is produced whereas if a lower voltage is passed to the LED (312), a lower intensity of the colored light is produced. Accordingly, by varying the intensity and/or brightness of the different LEDs (312) individually, each color on the visible spectrum may be represented. For example, in some cases the intensity spectrum of each LED (312) may be on a scale from 0 to 255, with 255 being the highest intensity for that LED (312) and 0 being the lowest intensity for that LED (312). Accordingly, by varying the intensity of each individual LED (312), different emitted colors are possible. For example, a red output may be generated by setting the red LED (312) to an intensity of 255, the green LED (312) to an intensity of 0, and the blue LED (312) to an intensity of 0. In yet another example, a blue output may be generated by setting the red LED (312) to an intensity of 0, the green LED (312) to an intensity of 0, and the blue LED (312) to an intensity of 255. Other combinations are possible as well. For example, a purple color light may be generated by setting the red LED (312) intensity to 128 on the scale, the green LED (312) intensity to 0 on the scale, and setting the blue LED (312) intensity to 128 on the scale. In other words, in the example depicted in FIG. 3, the light source (FIG. 1, 106) includes multiple LEDs (312) whose characteristics are adjustable and combinable to represent any variety of colors along a continuous visible spectrum. Thus a fine-grained representation of processor (102) power usage is facilitated.

Accordingly, in this example, the controller (108) includes an output (316) per LED (312) to adjust a characteristic of a respective LED (312) based on a determined voltage consumption level of the processor (104). That is, the controller (108) determines a desired intensity for each LED (312) given a particular determined processor (104) voltage consumption level and outputs an electrical current or voltage that will result in the desired intensity for that LED (312). Doing so for each LED (312) individually allows for any desired overall color to be generated and emanated through the window (FIG. 2, 210) to provide the visual indication of processor (104) usage to the user. For simplicity, just one instance of an output (316) is indicated with a reference number.

In this example, the controller (108) includes an input (314) to receive a voltage consumption level of the processor (104). That is, as described above, the voltage consumption level of the processor (104) may indicate processor (104) usage. For example, a processor (104) that is in an idle state may have a voltage consumption of less than 0.6 volts (V). By comparison, an active processor (104) may have a voltage value of between 0.6 V and 1.52 V. Accordingly, the input (314) receives an indication of the voltage on the processor (104). Then as described above, a mapping is generated between the voltage level and a desired light source (FIG. 1, 106) output. If the processor (104) is in an active mode, that is it is being used, the controller (108) then determines an intensity for each LED (312) which will result in the desired output and passes, per LED (312), an electrical signal to generate a light signal with the desired intensity to generate the desired output. If the processor (104) is in an idle mode, for example if the voltage consumption is less than 0.6 V, the controller (108) may turn off each of the LEDs (312).

In this example, the computing device (100) includes a database (320) that maps determined usage, or voltage consumption, levels of the processor (104) to characteristics of the light source (FIG. 1, 106). For example, the database (320) may include mappings between voltage levels and desired output colors. In some examples, the mapping may have any degree of resolution. That is, the mapping may have entries of tenths of voltages or hundredths of voltages. In either case, each entry may have a particular output color associated with it. For example, a light usage, i.e., low voltage value, may map to a blue color, a moderate usage, i.e., medium voltage, may map to a green color, and a high usage, i.e., high voltage, may map to a red color. Other usages may also map to other colors. Thus, in summary, the spectrum of potential voltages may each be mapped to a spectrum of potential colors such that a gradient of colors is possible, which indicates a relative loading of the processor (104).

In addition to mapping to a particular output color, the database (320) may include a mapping to distinct settings for each of multiple LEDs (312) to generate the particular output color. For example, in one case the voltage value of 0.7 V may map to an output purple color. To generate the purple color, a red LED (312) may be set to a value of 128 on a scale from 0-255, where the value maps to a relative intensity or brightness of the LED (312) across the scale. In this same example, a green LED (312) may be set to a value of 0, and the blue LED (312) may be set to a value of 128. Accordingly, in this example, the database (320) may include a mapping between the 0.7 V value and a value of 128 for the red LED (312), 0 for the green LED (312), and 128 for the blue LED (312). Thus, any desired color may be generated to represent any desired consumption level.

The database (320) may also include a mapping between distinct settings for each of the multiple LEDs (312) and modulations to be done to the control signal to achieve the desired setting. For example, if a desired intensity setting for a particular color of LED is 255, a control signal may not be altered. BY comparison, if a less intense version of the LED (312) color is desired, say 150, then the control signal may be altered, for example reduced, such that the desired intensity results. In other words, there is a correlation between control signal strength and LED (312) intensity and the database (320) may include a mapping of this correlation. The database (320) may also indicate the voltage threshold under which the LEDs (312) are turned off.

Figure 4:
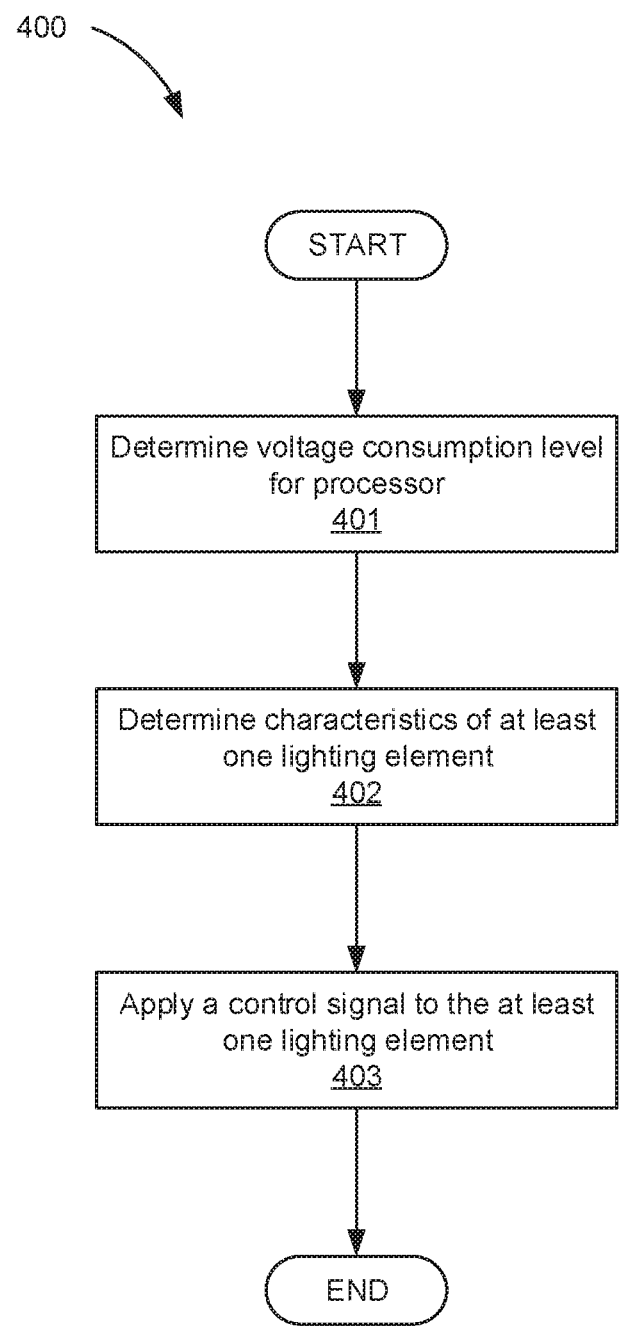
FIG. 4 is a flowchart of a method for usage-based lighting adjustments, according to an example of the principles described herein.

FIG. 4 is a flowchart of a method (400) for usage-based lighting adjustments, according to an example of the principles described herein. According to the method (400), a voltage consumption level of a processor (FIG. 1, 104) is determined (block 401). As described above, the usage level of the processor (FIG. 1, 104) can be approximated or determined via the voltage consumption level of the processor (FIG. 1, 104). The voltage consumption of the processor (FIG. 1, 104) during active mode may be between 0.6 and 1.52 V, with anything less than 0.6 V indicating the processor (FIG. 1, 104) is in an idle mode. Different voltage values between 0.6 V and 1.52 V indicate different levels of load on the processor (FIG. 1, 104). That is, 0.6 V may indicate a light load on the processor (FIG. 1, 104), i.e., not many applications or not many bandwidth-heavy applications are running. By comparison, a 1.5 V level for the processor (FIG. 1, 104) may indicate that many applications or a few bandwidth-heavy applications are running. As will be described below, the determination (block 401) of the processor (FIG. 1, 104) voltage consumption level may be determined by receiving an indication of the voltage passed from the power supply system to the processor (FIG. 1, 104).

With the processor (FIG. 1, 104) voltage consumption level determined (block 401), characteristics of at least one lighting element of the light source (FIG. 1, 106) are determined (block 402). For example, in the case of red, blue, and green LEDs (FIG. 3, 312), a desired output color may be determined. The desired intensity of each LED (FIG. 3, 312) to achieve that color is then determined. For example, if the voltage consumption level for the processor (FIG. 1, 104) is determined to be 0.7 V indicating a light loading, but still active, the controller (FIG. 1, 108) may determine that a purple output color should be displayed through the window (FIG. 2, 210) of the housing (FIG. 1, 102). Accordingly, the controller (FIG. 1, 108) may determine that an intensity of 128 from each of the red LED (FIG. 3, 312) and the blue LED (FIG. 3, 312) and an intensity of 0 from the green LED (FIG. 3, 312) will result in the desired purple output color. In another example, if the voltage consumption level for the processor (FIG. 1, 104) is determined to be under 0.6 V indicating the processor (FIG. 1, 104) is in an idle mode, the controller (FIG. 1, 108) may determine to turn off the LEDs (FIG. 3, 312). As described above, the mapping between an output color and/or intensity of each individual LED (FIG. 3, 312) and the determined voltage consumption level may be stored in a database on the computing device (FIG. 1, 100).

The controller (FIG. 1, 108) then applies (block 403) a control signal to each of the lighting elements based on the determined characteristics. That is, the controller (FIG. 1, 108) may send electrical signals with particular current levels to the red and blue LEDS (FIG. 3, 312) such that colors having an intensity value of 128 are emitted from the respective LEDs (FIG. 3, 312). In this example, as the green LED (FIG. 3, 312) has an intensity of 0, the control signal applied (block 403) to the green LED (FIG. 3, 312) may be 0. While particular reference is made to a particular voltage value and particular intensities, any number of color outputs may be generated to represent a voltage loading of any particular value. Thus, the present method (400) allows for a fine-tune mapping between voltage consumption and emitted color such that a user may have an accurate indication of the loading of their processor (FIG. 1, 104) such that any appropriate action may be taken if desired.

Figure 5:
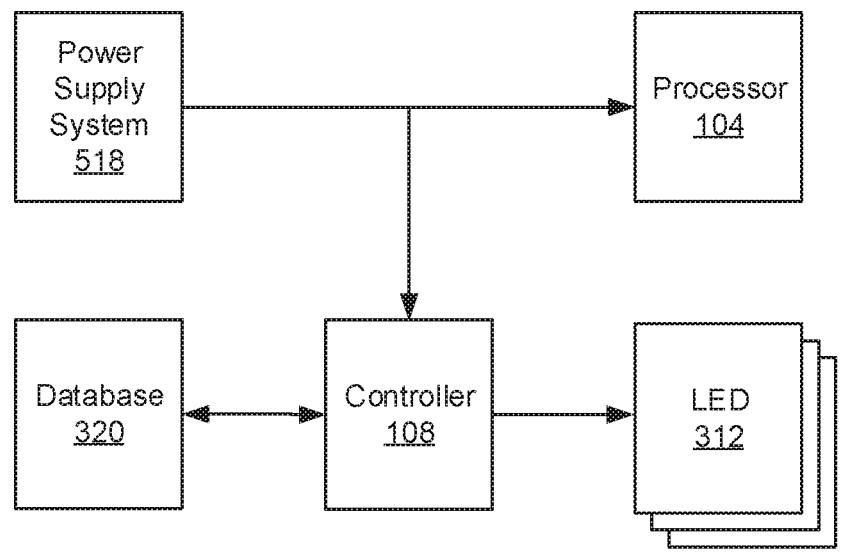
FIG. 5 is a diagram of a computing device with usage-based lighting adjustments, according to an example of the principles described herein.

FIG. 5 is a diagram of a computing device (FIG. 1, 100) with usage-based lighting adjustments, according to an example of the principles described herein. Specifically, FIG. 5 depicts the inputs and outputs to the controller (108) which makes the determination as to how the LEDs (312) should be illuminated based on information contained in the database (320). In some examples, the computing device (FIG. 1, 100) includes a power supply system (518). As described above, the operating power, or consumed amount of voltage, of the processor (104) indicates a usage level of the processor (104). The power supply system provides operating power to the processor (104) and may include various components. For example, the power supply system (518) includes a power source that provides power to the processor (104) and other components of the computing device (FIG. 1, 100). For example, the power source may provide 12 V of energy to the different components. The power may be delivered to a power width modulation (PWM) device that alters the supplied power to be within a desired range. The power supply system (518) may also include a low-dropout (LDO) regulator which regulates the output voltage. That is, the LDO receives an input voltage and then generates a desired output voltage. The output voltage is then passed to different MOS circuits in parallel and ultimately to the processor (104) where it is used to power the processor (104) to carry out its different functions. While particular reference is made to a specific power supply system (518) with particular components, other power supply systems (518) may be implemented in accordance with the principles described herein. In general, the power supply system (518) provides operating power to the processor (104).

In the present computing device (FIG. 1, 100), the voltage that is passed to the processor (104), or a representation thereof, may be passed to the controller (108). In other words, determining the usage level of the processor (104) may include receiving the voltage value from the power supply system (518). In some examples, the controller (108) may be an embedded controller (108) of the computing device (FIG. 1, 100) that is used to control hardware components of the computing device (FIG. 1, 100).

Receiving the voltage consumption level from the power supply system (518) represents a simple way of determining voltage consumption, and thereby usage, of the processor (104). That is, the voltage value is already being passed to the processor (104) and so with minimal circuitry the power transmission line running between the power supply system (518) and the processor (104) may be coupled to the controller (108), such that the controller (108) can use this information to 1) determine the load on the processor (104) and 2) control the LEDs (312) based on the determined load. In other words, the present computing device (FIG. 1, 100) includes a transmission line that is tied into the power supply system (518)/processor (104) transmission line to observe and track the voltage being supplied to the processor (104).

Figure 6:
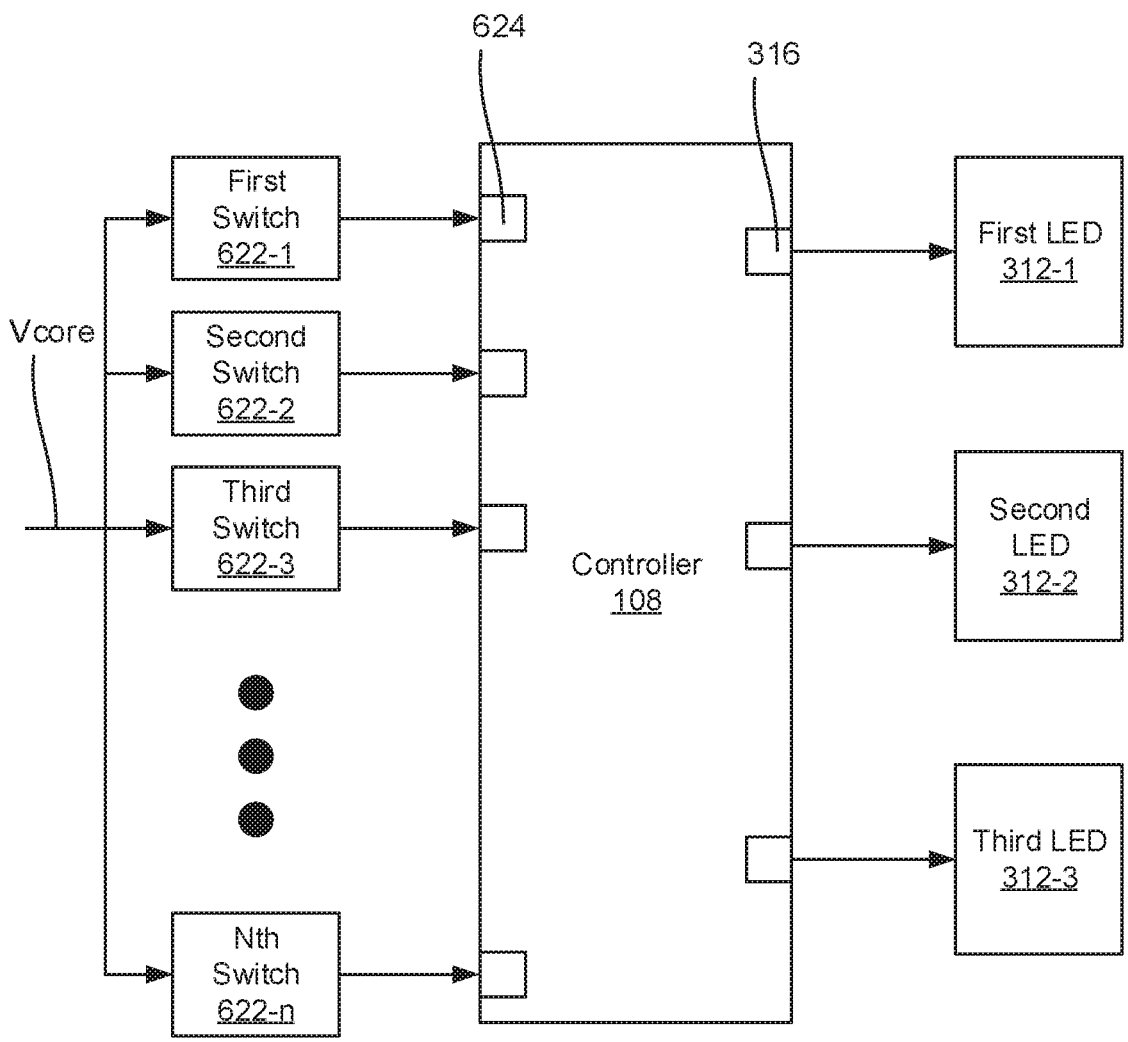
FIG. 6 is a diagram of a controller for usage-based lighting adjustments, according to an example of the principles described herein.

FIG. 6 is a diagram of a controller (108) for usage-based lighting adjustments, according to an example of the principles described herein. As described above, the controller (108) receives a determined voltage consumption level and from this controls the output characteristics of the light source (FIG. 1, 106), which in the example depicted in FIG. 6 includes multiple LEDs (312). This determination may occur in a variety of ways. For example, in one case the input (FIG. 3, 314) includes a number of input ports (624). For simplicity, a single input port (624) is indicated with a reference number. Coupled to each input port (624) is a switch (622) that is toggled by a particular voltage value. In one example, the switch (622) is a component that allows an input signal to pass when the switch (622) is toggled. In another example, the switch (622) generates a signal when it has been toggled.

The triggers for the different switches (622) may be different voltage values. That is, each switch (622) is to toggle based on a different voltage threshold. For example, a first switch (622-1) may toggle when a voltage value of 0.5 V is received, a second switch (622-2) may toggle when a voltage value of 0.6 V is received, a third switch (622-3) may toggle when a voltage value of 0.7 V is received, and an n-th switch (633-n) may toggle when a voltage value of 1.52 V is received. While FIG. 6 depicts a certain number of switches (622), any number of switches (622) may be used in the controller (108) with the resolution of the voltage consumption determination being dependent upon the number of switches (622).

In this example, a determination as to the voltage consumption level of the processor (FIG. 1, 104) is determined by which input ports (646) receive an indication that an associated switch (622) has been toggled. For example, presume that a voltage consumption value, $V_{core}$, of 0.65 V is passed to the switches (622) along the transmission line. In this example, the first switch (622-1) is toggled on account of the 0.65 V received value being greater than the toggle value of 0.5 V for the first switch (622-1). Still further, the second switch (622-2) is toggled on account of the 0.65 V received value being greater than the toggle value of 0.6 V for the second switch (622-2). By comparison, the third switch (622-3) is not toggled on account of the 0.65 V received value being less than the toggle value of 0.7 V for the third switch (622-3). Accordingly, the 0.65 V value, or an indication that the first switch (622-1) and the second switch (622-2) have been toggled, is passed to the controller (108) via the respective input ports (624). The controller (108) then uses this information, and the mapping included in the database (FIG. 5, 518) to determine what strength of signal to pass to the respective LEDs (312) to generate the color that maps to the 0.65 V value received.

As described above, to control the LEDs (312) or other light source (FIG. 1, 106), the controller (108) includes an output (316) per light source (FIG. 1, 106). In this example, each output (316) includes a power adjustment circuit such as a pulse width modulation (PWM) circuit. The power adjustment circuit alters characteristics of an output signal. In the specific context of the computing device (FIG. 1, 100), the power adjustment circuit modulates the control signal to each LED (312) such that a desired intensity of light results. For example, given a desired output color of orange, wherein the desired red LED (312) value is 255, the desired green LED (312) value is 165, and the desired blue LED (312) value is 0, the output corresponding to the red LED (312) may allow an unmodified control signal to pass through. By comparison, the output (316) corresponding to the green LED (312) may reduce the control signal to a value that maps to the desired intensity of 165. By comparison, the output (316) corresponding to the blue LED (312) may be blocked such that no control signal is passed.

Figure 7:
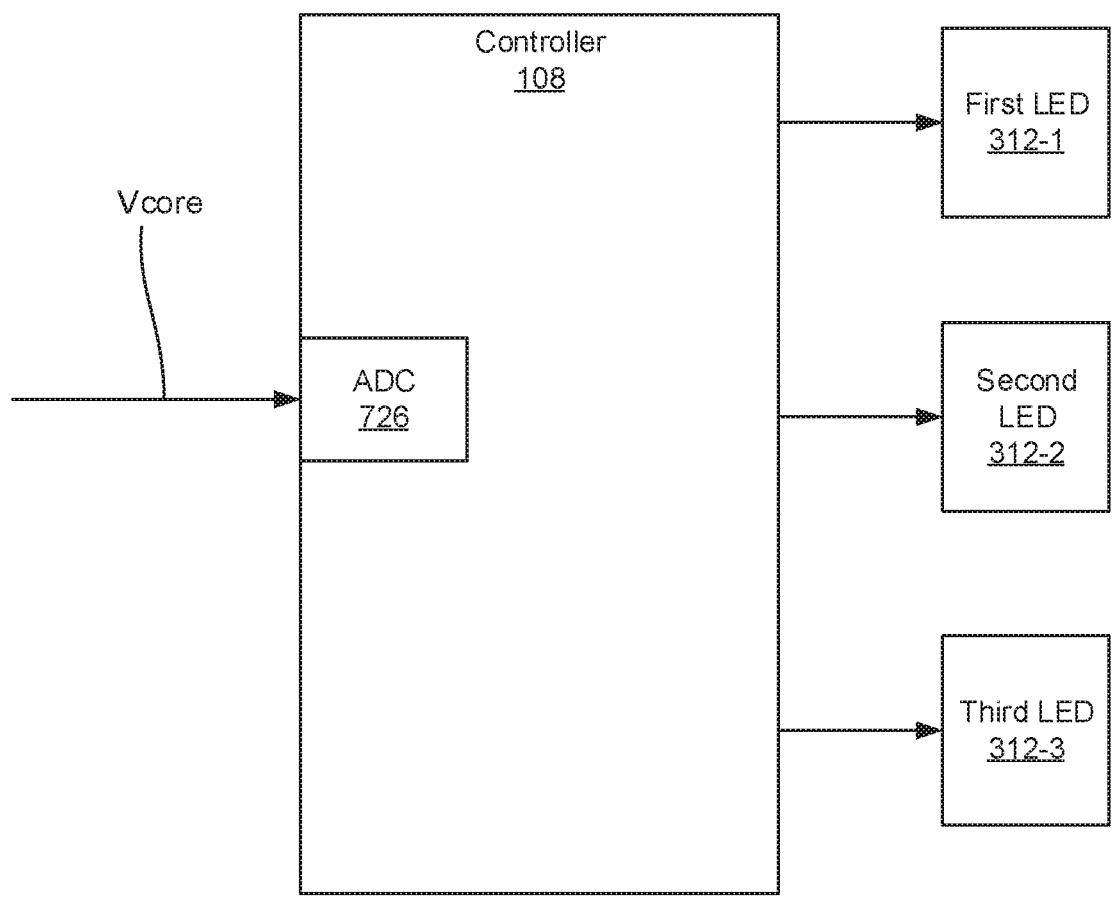
FIG. 7 is a diagram of a controller for usage-based lighting adjustments, according to another example of the principles described herein.

FIG. 7 is a diagram of a controller for (108) usage-based lighting adjustments, according to another example of the principles described herein. In the example depicted in FIG. 7, the input (FIG. 3, 314) includes an analog-to-digital converter (ADC) (726). In this example, rather than relying on switches (FIG. 6, 622) and the resolution of the system being dependent on the number of switches (FIG. 6, 622), any value can be received and mapped to a digital value. In this example, the digital value indicates the voltage consumption level of the processor (FIG. 1, 104). For example, an analog voltage value of 0.7 V is received and converted into a digital value. This digital value can be mapped directly to 1) an output color, 2) constituent intensities for each LED (312) that result in the output color, and/or 3) modulations to be made to control signals for each LED (312) to realize the desired intensity per LED (312).

Figure 8:
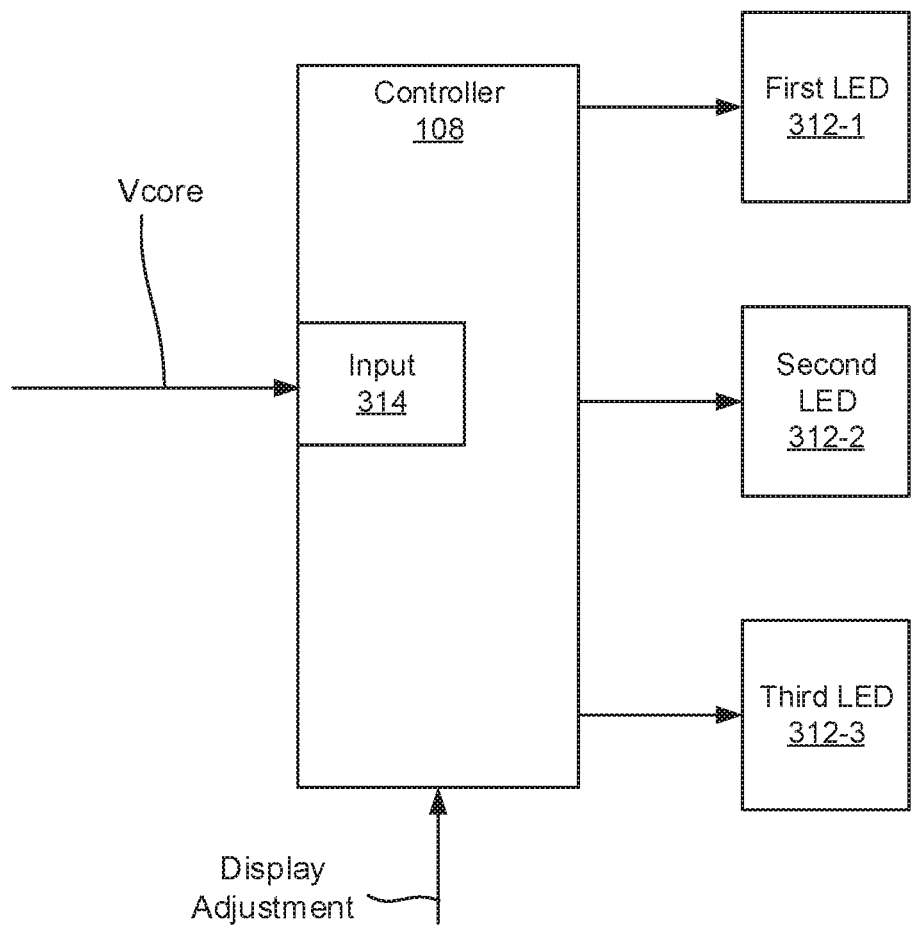
FIG. 8 is a diagram of a controller for usage-based lighting adjustments, according to another example of the principles described herein.

FIG. 8 is a diagram of a controller (108) for usage-based lighting adjustments, according to another example of the principles described herein. As described above, adjusting characteristics of the light source (FIG. 1, 106), which in the example depicted in FIG. 8 are LEDs (312), may include turning off the light source (FIG. 1, 106) based on the determined usage level. That is, each LED (312) may be blocked from illuminating light. This may be done by not passing an electrical stimulus to the LEDs (312). Such a turning off of the LEDs (312) may be done when the determined usage level is below a threshold value. For example, as described above, the voltage consumption level of the processor (FIG. 1, 104) less than a particular value, such as 0.6 V, indicates that the processor (FIG. 1, 104) is in an idle state. In such an idle state, it may be desirable to conserve power. Accordingly, when the processor voltage consumption level is below this threshold value, the controller (108) turns off the LEDs (312).

In some examples, the determination to turn off the LEDs (312) may be based solely on the voltage consumption level of the processor (FIG. 1, 104) and in other examples may be based on additional information, such as a display adjustment. That is, in addition to recognizing that a voltage level is below a certain threshold, the controller (108) may turn off the LEDs (312) when it is determined that a display coupled to the computing device (FIG. 1, 100) has been turned off.

That is, the controller (108) receives 1) an indication that a display coupled to the computing device (FIG. 1, 100) has been altered and 2) a voltage consumption level of the processor, $V_{core}$. If the indication signals that the computing device (FIG. 1, 100) display has been altered and $V_{core}$ is below the threshold level, for example 0.6 V, then the controller (108) turns off each of the LEDs (312), thus conserving power. Both are used because the indication alone may not indicate that the display has been turned off, but may just indicate that its operation has been adjusted. That is, the indication may indicate that the display has been placed in a standby mode, the brightness has been adjusted, or some other display setting has been adjusted. It may not be desirable to turn off the LEDs (312) when the brightness has been adjusted or another display setting has been adjusted. Accordingly, by relying on both the indication that the display has been adjusted and that the processor (104) has a voltage consumption level less than a threshold value, the controller (108) determines that the processor (104) is in an idle mode and controls the LEDs (312) appropriately.

As described above, such a system may be implemented in hardware. As a specific example, a user may select a time period after which if the computing device (FIG. 1, 100) is inactive, the display is shut down. When an operating system counter of the computing device (FIG. 1, 100) reaches this selected time period, it may send a command to the controller (FIG. 1, 104) or another controller to turn off the display screen. This same command may be used by the controller (FIG. 1, 104) to turn off the LEDs (312) on the housing (FIG. 1, 102). That is, the controller (FIG. 1, 104) may capture the command and at that point in time determine the voltage consumption level. If at the time of receiving the display-off command, the controller (FIG. 1, 104) determines that the voltage consumption level is less than the threshold amount, the controller (FIG. 1, 104) may determine that the computing device (FIG. 1, 100) is in an idle state and may turn off the LEDs (312) on the housing (FIG. 1, 102). By comparison, if at the time of receiving the display-off command, the controller (FIG. 1, 104) determines that the voltage consumption level is greater than the threshold amount, the controller (FIG. 1, 104) may determine that the computing device (FIG. 1, 100) is not in an idle mode and may maintain the LEDs (312) in an active state. A command being received and the voltage consumption level greater than the threshold may indicate some other adjustment to the display, such as a change in brightness.

Figure 9:
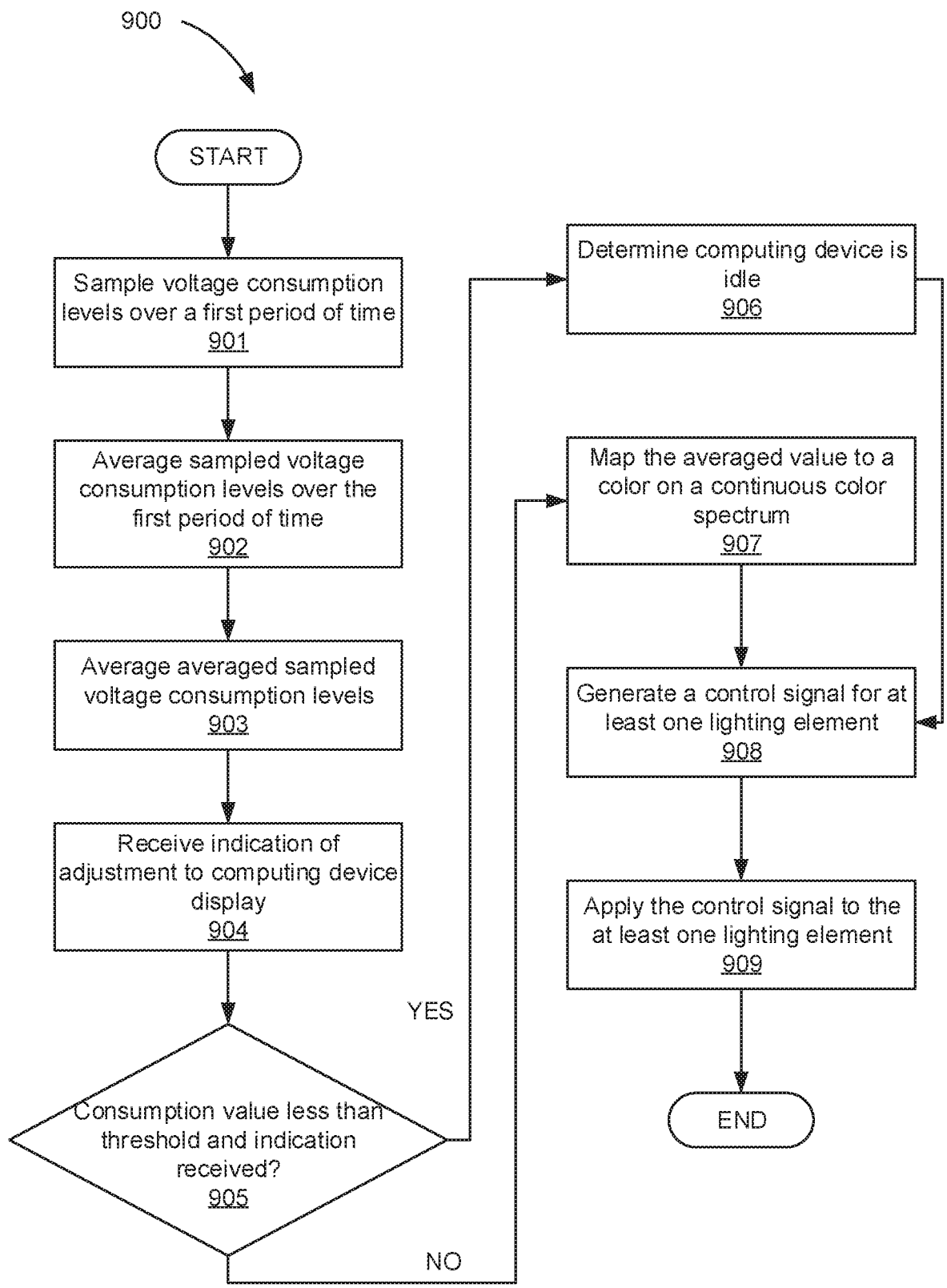
FIG. 9 is a flowchart of a method for usage-based lighting adjustments, according to another example of the principles described herein.

FIG. 9 is a flowchart of a method (900) for usage-based lighting adjustments, according to another example of the principles described herein. During use, the processor (FIG. 1, 104) may experience different load levels. In some examples, the load level changes multiple times per second. Determining load level various times per second and changing the lighting characteristics of multiple LEDs (FIG. 3, 312) multiple times per second may be computationally expensive. Moreover, changing the light color that often may be unpleasant to a user and may reduce the value as it may be difficult to interpret processor usage (FIG. 1, 104) based on changes in color that occur multiple times over a short period of time, even multiple times per second. Accordingly, the method (900) smooths out the color change such that it is smoother, less choppy, and more pleasing and useful to a user.

Accordingly, the method (900) includes sampling (block 901) voltage consumption levels over a first period of time. For example, the first period of time may be one second, and the sampling rate may be every 10 milliseconds such that over the 1 second time period, there are 100 sampled voltage consumption levels. The sampled voltage consumption values are then averaged (block 902) over the first time period. For example, the 100 sampled voltage consumptions levels are averaged (block 902) over the 1-second time period such that an averaged value is determined for that 1-second time period. Determining the characteristics based on an averaged value as opposed to each measured value smooths out any color change over time as the changes to the lighting characteristics occur once for every time period, i.e., once every second, as opposed to once every measurement, i.e., once every 10 milliseconds. This reduces the computation bandwidth to determine voltage consumption levels and adjusted lighting characteristics and also results in a smoother transition between changes in color.

In another example, the averaged values may again be averaged (block 803). In other words, averaged sampled voltage consumption values from different periods of time may be averaged together. That is, an averaged value over a first 1-second time period may be averaged with a second 1-second time period average. As a specific numeric example, a first averaged value may be 1.1 V over a first 1-second time period and a second averaged value may be 1.3 V over a second 1-second time period. These two values may be averaged together, resulting in a 2-second voltage consumption level of 1.2 V. As with the first averaging, the second averaging (block 903) further smooths out the changes between real-time measurements and adjustments.

In this example, an indication is received (block 904) of an adjustment to the computing device display. Such an indication may be indicative of any type of adjustment to the display screen including a turning off of the display screen due to the computing device (FIG. 1, 100) being idle for a predetermined period of time, the computing device (FIG. 1, 100) being turned off, the display screen brightness being changed or any number of other display screen adjustments. It is then determined (block 905) whether the voltage consumption value is less than a threshold value and whether the indication was received. If both these conditions are true (block 905, determination YES), it is determined (block 906) that the computing device is idle. In this case, a control signal is generated (block 908) as described above in connection with FIG. 4. In this example, the control signal turns off the at least one lighting element and applying (block 909) the control signal therefore turns off the lighting elements.

By comparison, if just one or neither of these conditions is met (block 905, determination NO), it is determined that the computing device (FIG. 1, 100) and processor (FIG. 1, 104) are still active and that any received indication was not related to the powering down of the display screen and/or computing device (FIG. 1, 100).

In this case, the averaged value is mapped (block 907) to a color on a continuous spectrum. That is, as described above the received value, be it an averaged value, a twice-averaged value, or an exact value, is mapped to a desired output color along a continuous spectrum. A control signal is then generated (block 908) for each of at least one lighting element of a light source (FIG. 1, 106). In the example where the light source (FIG. 1, 104) includes multiple LED (FIG. 3, 312) elements, this may mean a control signal is generated for each LED (FIG. 3, 312) element. The control signal being such that an intended intensity for that LED (FIG. 3, 312) is generated. As described above, the intended intensity is an intensity such that each LED (FIG. 3, 312), when combined with the other LED (FIG. 3, 312) light waves, results in the desired output color. The generated control signals are then applied (block 909) to the lighting elements such that each is emitting at the intended intensity and that when combined result in the desired output. As such, the method (900) as described herein results in the generation of a visible color output from which a user can easily determine how hard the processor (FIG. 1, 104) of the computing device (FIG. 1, 100) is working.

Such a computing device 1) provides a simple visual cue of processor usage; 2) is easily implemented on the computing device with simple hardware components; 3) improves overall computing device performance; and 4) increases component operating life.

What is claimed is:

1. A computing device, comprising:
a housing;
a processor;
a light source to illuminate through a window in the housing; and
a controller to:
determine a usage level of the processor, including to sample the usage level over a first time period, and average the sampled usage level, and
adjust a characteristic of the light source based on the average sampled usage level of the processor.

2. The computing device of claim 1, in which:
the light source comprises multiple light emitting diodes (LEDs) whose characteristics are to be adjusted and combined to output a variety of colors along a continuous visible spectrum; and wherein the continuous visible spectrum maps to a spectrum of usage levels of the processor.

3. The computing device of claim 1, in which the controller is to sample the usage level by sampling a processor voltage level.

4. The computing device of claim 1, further comprising a power supply system to deliver a voltage to the processor, in which:
the voltage supplied indicates a usage level of the processor; and
sampling the usage level of the processor comprises receiving the voltage value from the power supply system.

5. The computing device of claim 1, further comprising a database to map determined usage levels to characteristics of the light source.

6. The computing device of claim 1, in which adjusting a characteristic of the light source comprises turning off the light source based on the determined usage level.

7. The computing device of claim 6, in which the light source is to be turned off when the average sampled usage level is below a threshold value.

8. The computing device of claim 1, wherein the controller is to:
determine an updated usage level of the processor, including to:
sample the usage level over a second time period following the first time period, and
average the sampled usage level over the second time period; and
adjust the characteristic of the light source based on the average sampled usage level over the second time period.

9. A computing device, comprising:
a housing;
a processor;
multiple light emitting diodes (LEDs) to illuminate through a window in the housing, wherein characteristics of the LEDs are to be adjusted and combined to output any of a variety of colors along a continuous visible spectrum; and
a controller comprising:
an input to receive sampled voltage consumption levels of the processor over a first time period; and
an output per LED to adjust a characteristic of a respective LED based on an average of the sampled voltage consumption levels of the processor over the first time period, in which the voltage consumption level maps to a color along the continuous visible spectrum; and
a database to map voltage consumption levels to characteristics of the multiple LEDs.

10. The computing device of claim 9, in which:
each output comprises a power adjustment circuit to adjust a power pulse to a respective LED;
the input comprises a number of input ports;
the device further comprises a number of switches, each coupled to a respective input port;
each switch is to toggle based on a different voltage threshold; and
a determination of which switches are toggled is to indicate the voltage consumption level of the processor.

11. The computing device of claim 9, wherein:
each output comprises a power adjustment circuit to adjust a power pulse to a respective LED;
the input comprises an analog to digital convert to convert the voltage consumption level of the processor to a digital value; and
the digital value indicates the voltage consumption level of the processor.

12. The computing device of claim 9, wherein:
the input is to receive additional sampled voltage consumption levels of the processor over a second time period following the first time period; and
the output per LED is to adjust the characteristic of the respective LED based on an average of the sampled voltage consumption levels of the processor over the second time period.

13. The computing device of claim 9, wherein:
the input is to receive additional sampled voltage consumption levels of the processor over a second time period following the first time period; and
the output per LED is to adjust the characteristic of the respective LED based on an average of the average of the sampled voltage consumption levels of the processor over the first time period and an average of the sampled voltage consumption levels of the processor over the second time period.

14. A method comprising:
determining a voltage consumption level of a processor of a computing device including
sampling voltage consumption levels over a first period of time, and
averaging sampled voltage consumption levels;
based on an averaged sampled voltage consumption level, determining characteristics of at least one lighting element, wherein the at least one lighting elements are to illuminate through a window on a housing of the computing device; and
applying a control signal to the at least one lighting element based on the determined characteristics.

15. The method of claim 14, wherein determining characteristics of each of the at least one lighting elements comprises:
mapping the voltage consumption level to a color on a continuous color spectrum; and
generating, for each of the at least one lighting element, the control signal such that a combined output of the at least one lighting elements results in a mapped color.

16. The method of claim 14:
further comprising:

determining the average sampled voltage consumption level of the processor of the computing device is below a threshold level;

receiving from the computing device an indication of an adjustment to a computing device display; and wherein applying a control signal to the at least one lighting element:
- is based on the determined average sampled voltage consumption level and the indication; and
- turns off the at least one lighting element.

17. The method of claim 14, further comprising averaging the averaged sampled voltage consumption levels.

18. The method of claim 14, further comprising
determining an updated voltage consumption level of the processor of the computing device, including
- sampling additional voltage consumption levels over a second period of time, and
- averaging the additional sampled voltage consumption levels;

based on the additional averaged sampled voltage consumption level, determining updated characteristics of the at least one lighting element; and applying an updated control signal to the at least one lighting element based on the determined updated characteristics.

19. The method of claim 14, wherein:

determining the voltage consumption level of the processor of the computing device further comprises sampling voltage consumption levels over a second period of time;

averaging the sampled voltage consumption levels comprises averaging the sampled voltage consumption levels from the first period of time to obtain a first averaged value, and averaging the sampled voltage consumption levels from the second period of time to obtain a second averaged value; and further comprising averaging the first averaged value and the second averaged value to obtain the averaged sampled voltage consumption level.

* * * * *